United States Patent
Li et al.

(10) Patent No.: US 9,780,231 B1
(45) Date of Patent: Oct. 3, 2017

(54) INTEGRATED CIRCUITS WITH FLASH MEMORY AND METHODS FOR PRODUCING THE SAME

(71) Applicant: Globalfoundries Singapore Pte. Ltd., Singapore (SG)

(72) Inventors: Pinghui Li, Singapore (SG); Ming Zhu, Singapore (SG); Danny Pak-Chum Shum, Singapore (SG); Xinshu Cai, Singapore (SG); Darin Chan, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 15/271,528

(22) Filed: Sep. 21, 2016

(51) Int. Cl.
*H01L 29/788* (2006.01)
*H01L 29/06* (2006.01)
*H01L 29/66* (2006.01)

(52) U.S. Cl.
CPC ...... *H01L 29/7881* (2013.01); *H01L 29/0649* (2013.01); *H01L 29/66825* (2013.01)

(58) Field of Classification Search
USPC .......... 257/314–326, E27.078, 295, 257/E43.001–E43.007, E27.005–E27.006, 257/E29.167, E27.272, E29.323, E21.436, 257/E29.272, E21.663–E21.665; 438/3, 438/785, E21.208
See application file for complete search history.

(56) References Cited

U.S. PATENT DOCUMENTS

| | | | |
|---|---|---|---|
| 6,115,287 A | 9/2000 | Shimizu et al. | |
| 6,975,014 B1 * | 12/2005 | Krivokapic | H01L 29/42384 257/506 |
| 7,502,262 B2 | 3/2009 | Park et al. | |
| 7,679,125 B2 | 3/2010 | Swift et al. | |
| 7,855,417 B2 * | 12/2010 | Chen | H01L 27/115 257/324 |

* cited by examiner

*Primary Examiner* — Tram H Nguyen
(74) *Attorney, Agent, or Firm* — Lorenz & Kopf, LLP (57) ABSTRACT

Integrated circuits and methods of producing such integrated circuits are provided. In an exemplary embodiment, an integrated circuit includes a substrate with an active layer overlying a handle layer. A partial buried insulator overlies the handle layer and underlies the active layer, terminates at a buried insulator termination point, and includes an electrically insulating material. A substrate extension is adjacent to the partial buried insulator, where the substrate extension overlies the handle layer and underlies the active layer, and where the substrate extension directly contacts the partial buried insulator at the buried insulator termination point. The substrate extension includes a semiconductive material. A memory gate overlies the active layer.

20 Claims, 7 Drawing Sheets

INTEGRATED CIRCUITS WITH FLASH MEMORY AND METHODS FOR PRODUCING THE SAME

TECHNICAL FIELD

The technical field generally relates to integrated circuits with flash memory and methods of producing the same, and more particularly relates to integrated circuits with flash memory using silicon-on-insulator substrates and methods of producing the same.

BACKGROUND

The semiconductor industry is continuously moving toward the fabrication of smaller and more complex microelectronic components with higher performance. The production of smaller integrated circuits requires the development of smaller electronic components, and closer spacing of those electronic components within the integrated circuits. Memory cells are an important part of many microelectronic components, and smaller and more reliable memory cells are desirable. One type of memory cell is a flash memory cell which is a nonvolatile and re-writable memory cell. Non-volatile memory cells retain stored information even when the memory cell is de-powered, and stored information can be changed when the memory cell is re-writable. buried insulator Some integrated circuits include fully depleted semiconductor-on-insulator (FDSOI) transistors that have advantages over transistors that do not include a fully depleted channel, such as reduced short channel effects and reduced parasitic capacitances. These integrated circuits may utilize a semiconductor-on-insulator (SOI) substrate that has a shallow active layer overlying a buried insulator layer. Memory cells produced in conjunction with the FDSOI transistors utilize the SOI substrate with the very shallow active layer, so the memory cell is designed accordingly. The shallow active layer may present challenges for non-volatile memory cells. For example, holes generated by impact ionization during channel hot-electron injection may produce a positive bias in the floating body, which in turn may decrease the threshold voltage. This has been referred to as the "kink" effect. The kink effect may be more pronounces in partially drained semiconductor-on-insulator (PDSOI) substrates. Furthermore, very high voltages may be required to influence the memory cell through the buried insulator layer for erase operations.

Accordingly, it is desirable to provide integrated circuits including semiconductor-on-insulator substrates with memory cells having higher threshold voltages, and methods of producing the same. In addition, it is desirable to provide integrated circuits on semiconductor-on-insulator substrates with memory cells that require traditional erase voltages, as compared to integrated circuits with the high erase voltages required to influence a channel through a buried oxide layer. It is desirable to provide methods of producing the same. Furthermore, other desirable features and characteristics of the present embodiment will become apparent from the subsequent detailed description and the appended claims, taken in conjunction with the accompanying drawings and this background of the invention.

BRIEF SUMMARY

Integrated circuits and methods of producing such integrated circuits are provided. In an exemplary embodiment, an integrated circuit includes a substrate with an active layer overlying a handle layer. A partial buried insulator overlies the handle layer and underlies the active layer, terminates at a buried insulator termination point, and includes an electrically insulating material. A substrate extension is adjacent to the partial buried insulator, where the substrate extension overlies the handle layer and underlies the active layer, and where the substrate extension directly contacts the partial buried insulator at the buried insulator termination point. The substrate extension includes a semiconductive material. A memory gate overlies the active layer.

An integrated circuit is provided in another embodiment. The integrated circuit includes a substrate with an active layer overlying a partial buried insulator that in turn overlies a handle layer. First and second isolation structures pass through the active layer into the handle layer, where a memory area is defined between the first and second isolation structures, and where the partial buried insulator is within the memory area. A third isolation structure passes through the active layer into the handle layer, where a well contact area is defined between the second and third isolation structures. A memory gate overlies the active layer in the memory area, and a well contact is in electrical communication with the substrate in the well contact area. The well contact is also in electrical communication with the active layer in the memory area.

A method of producing an integrated circuit is provided in yet another embodiment. The method includes removing a portion of an active layer from a substrate and removing a portion of a buried insulator layer from the substrate to form a partial buried insulator, where a remaining portion of the active layer overlies the partial buried insulator. A substrate extension is epitaxially grown adjacent to the partial buried insulator, and the active layer is reformed directly overlying the substrate extension. First and second isolation structures are formed in the substrate such that the partial buried insulator and the substrate extension are positioned between the first and second isolation structures, and a memory gate is formed overlying the active layer between the first and second isolation structures.

BRIEF DESCRIPTION OF THE DRAWINGS

The present embodiments will hereinafter be described in conjunction with the following drawing figures, wherein like numerals denote like elements, and wherein.

DETAILED DESCRIPTION

The following detailed description is merely exemplary in nature and is not intended to limit the various embodiments or the application and uses thereof. Furthermore, there is no intention to be bound by any theory presented in the preceding background or the following detailed description. Embodiments of the present disclosure are generally directed to integrated circuits and methods for fabricating the same. The various tasks and process steps described herein may be incorporated into a more comprehensive procedure or process having additional steps or functionality not described in detail herein. In particular, various steps in the manufacture of integrated circuits are well-known and so, in the interest of brevity, many conventional steps will only be mentioned briefly herein or will be omitted entirely without providing the well-known process details.

An integrated circuit includes a memory gate overlying a partial buried insulator, where the memory gate also overlies a substrate extension that is adjacent to the partial buried insulator. The memory gate is positioned within a memory area that is separated from a well contact area by a shallow trench isolation structure, where a well contact in the well contact area is in electrical communication with the memory gate through a semiconductor material underlying the shallow trench isolation structure and through the substrate extension. The electrical communication between the well contact area and the memory gate allows the well contact to mitigate the accumulation of holes to avoid a kink effect in the memory gate. The electrical communication also allows the use of a lower voltage for erase operations than for integrated circuits with memory gates overlying a buried insulator layer that electrically isolates the memory gate from the well contact area.

Figure 1:
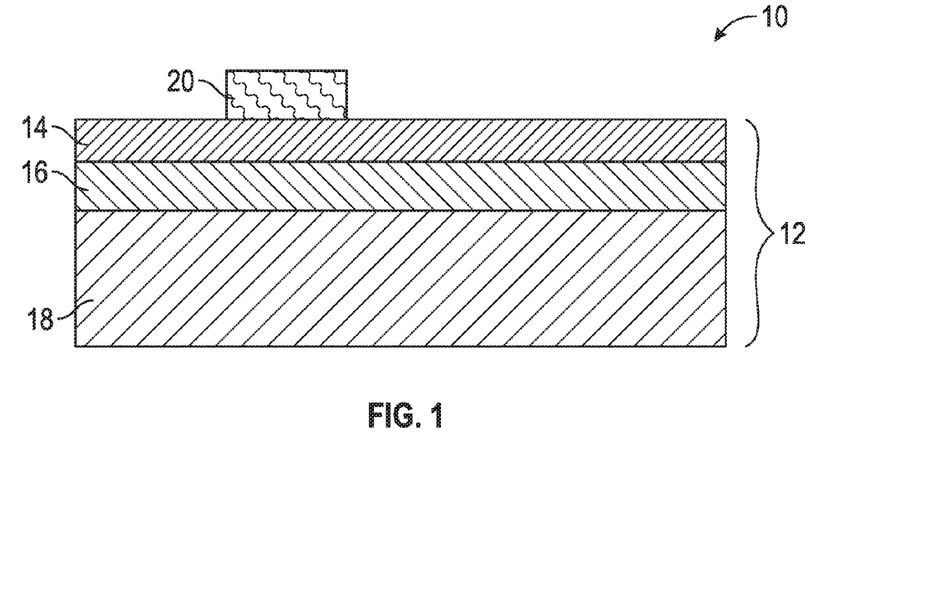
FIGS. 1-13 illustrate, in cross sectional views, an integrated circuit and methods for fabricating the same in accordance with exemplary embodiments.

Reference is made to an exemplary embodiment illustrated in FIG. 1. The integrated circuit 10 includes a substrate 12, where the substrate 12 includes an active layer 14 overlying a buried insulator layer 16, and where the buried insulator layer 16 overlies a handle layer. As such, the substrate 12 is a semiconductor-on-insulator (SOI) substrate, sometimes referred to as a silicon-on-insulator substrate (especially for embodiments where the active layer primarily includes silicon). As used herein, the term "overlying" means "over" such that an intervening layer may lay between the active layer 14 and the buried insulator layer 16, or "on" such that the active layer 14 physically contacts the buried insulator layer 16. Moreover, the term "directly overlying" means a vertical line passing through the upper component also passes through the lower component, such that at least a portion of the upper component is directly over at least a portion of the lower component. It is understood that the integrated circuit 10 may be moved such that the relative "up" and "down" positions change, so reference to a "vertical" line means a line that is about perpendicular to the surface of the substrate 12. In an exemplary embodiment, the active layer 14 and the handle layer 18 include semiconductive materials and have low concentrations of conductivity determining impurities (i.e., "dopants"), such as concentrations of about $1 \times 10^{13}$ cm$^{-3}$ or less.

As used herein, the term "semiconductor materials" will be used to encompass semiconductor materials conventionally used in the semiconductor industry from which to make electrical devices. Semiconductor materials include monocrystalline silicon materials, such as the relatively pure or lightly impurity-doped monocrystalline silicon materials typically used in the semiconductor industry, as well as polycrystalline silicon materials, and silicon admixed with other elements such as germanium, carbon, and the like. Semiconductor material also includes other materials such as relatively pure and impurity-doped germanium, gallium arsenide, zinc oxide, glass, and the like. In an exemplary embodiment, the active layer 14 is a monocrystalline silicon material, but other semiconductor materials may be used in alternate embodiments. The buried insulator layer 16 is silicon dioxide in an exemplary embodiment, but sapphire or other electrically insulating materials may also be used. The buried insulator layer 16 may be referred to as a BOX layer, where "BOX" typically stands for buried oxide, but it is to be understood that the buried insulator layer 16 may primarily include electrically insulating materials other than silicon dioxide in some embodiments, and may not include any silicon dioxide despite the use of the term BOX. The handle layer 18 provides mechanical strength and stability to the SOI substrate 12 and includes semiconductor materials, such as monocrystalline silicon in an exemplary embodiment. However, a wide variety of other semiconductor materials that provide mechanical strength and stability may be used in alternate embodiments.

As used herein, an "electrically conductive" material generally has a resistivity of about $1 \times 10^{-4}$ ohm meters or less, an "electrically insulating" material generally has a resistivity of about $1 \times 10^{4}$ ohm meters or more, and an "electrically semiconductive" materials has a resistivity of from less than about $1 \times 10^{4}$ ohm meters to more than about $1 \times 10^{-4}$ ohm meters. The term "electrical communication," as used herein, means electrical current is capable of flowing from one electrically conductive or semiconductive component to another, where the electrical current may or may not flow through an electrically conductive or electrically semiconductive intervening component. The term "direct electrical contact," as used herein, means direct physical contact between components that are electrically conductive or electrically semiconductive, but not electrical insulators.

A first photoresist layer 20 is formed and patterned overlying the substrate 12. The first photoresist layer 20 (and other photoresist layers described below) may be deposited by spin coating, and patterned by exposure to light or other electromagnetic radiation through a mask with transparent sections and opaque sections. The light causes a chemical change in the photoresist such that either the exposed portion or the non-exposed portion can be selectively removed. The desired locations may be removed with an organic solvent, and the first photoresist layer 20 remains overlying the other areas of the substrate 12. The first photoresist layer 20 (and other photoresist layers described below) may optionally include a top and/or bottom anti-reflective coating and/or a hard mask (not illustrated). Many anti-reflective coatings are available, including inorganic and organic compounds, such as titanium nitride or organosiloxanes. Titanium nitride may be deposited by chemical vapor deposition using tetramethylamidotitanium and nitrogen trifluoride, and organosiloxanes may be deposited by spin coating. Anti-reflective coatings may improve the accuracy and critical dimensions during photoresist patterning. Silicon nitride may be used as a hard mask, where silicon nitride can be formed by low pressure chemical vapor deposition using ammonia and dichlorosilane.

Figure 2:
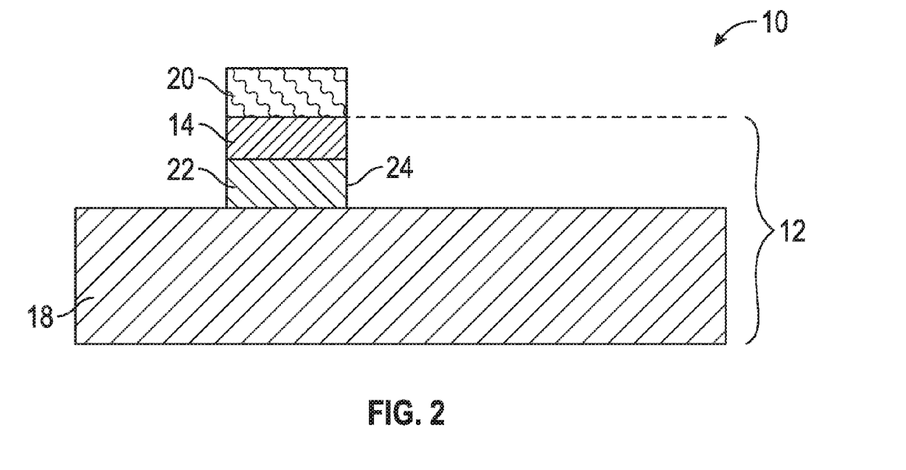

Referring to the exemplary embodiment in FIG. 2 with continuing reference to FIG. 1, portions of the active layer 14 and the buried insulator layer 16 are removed except where they are protected by the first photoresist layer 20. In an exemplary embodiment where the active layer 14 primarily includes monocrystalline silicon and the buried insulator layer 16 primarily includes silicon dioxide, the active layer 14 may be removed with a reactive ion etch using chlorine gas and hydrogen bromide and the buried insulator layer 16 may be removed with a reactive ion etch using carbon tetrafluoride. Other etchants or etch techniques may be used in alternate embodiments. The removal of portions of the buried insulator layer 16 produces a section referred to herein as a partial buried insulator 22, where the partial buried insulator 22 is a remaining portion of the buried insulator layer 16. As such, the partial buried insulator 22 ends at a buried insulator termination point 24, as opposed to extending throughout the substrate 12, where the buried insulator termination point 24 forms a vertical sidewall for the partial buried insulator 22. A remaining portion of the active layer 14 is positioned overlying the partial buried insulator 22. The first photoresist layer 20 (and other photoresist layers described herein) may be removed after use with an oxygen containing plasma.

Figure 3:
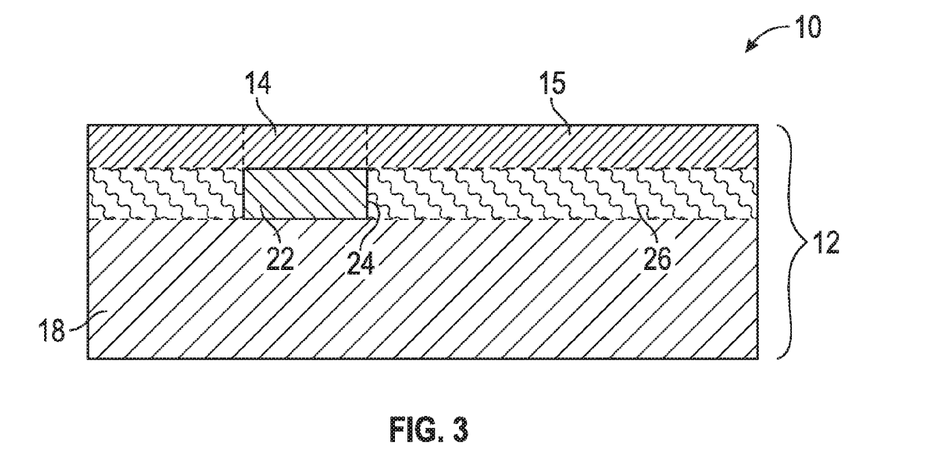

A substrate extension 26 may be epitaxially grown overlying the handle layer 18, as illustrated in an exemplary embodiment in FIG. 3 with continuing reference to FIGS. 1 and 2. The removed portions of the active layer 14 may also be reproduced, such as by epitaxially growth, to form an active layer extension 15 overlying the substrate extension 26, so the substrate extension 26 and the active layer extension 15 include a semiconductive material. In an exemplary embodiment, the substrate extension 26 and the active layer extension 15 are grown by vapor phase epitaxy using silicon tetrachloride and hydrogen gas, but other types of epitaxy can also be used, such as molecular beam epitaxy. Conductivity determining impurities of the desired type may be added to the source gas during the epitaxial growth, so the substrate extension 26 and/or the active layer extension 15 may include desired dopants at desired concentrations. In an exemplary embodiment, the substrate extension 26 and the active layer extension 15 include dopants at about the same relatively low concentration as the active layer 14 that was not removed, as described above. The substrate extension 26 overlies the handle layer 18, and is epitaxially grown based on the crystalline structure of the handle layer 18 in an exemplary embodiment. The substrate extension 26 also underlies the active layer extension 15 so the substrate extension 26 occupies the space previously occupied by the buried insulator layer 16 that was removed. As such, the substrate extension 26 terminates at the buried insulator termination point 24, where the substrate extension 26 directly contacts the partial buried insulator 22 at the same level within the substrate 12. The active layer extension 15 is a replacement portion of the active layer 14, so reference to the active layer 14 herein includes the active layer extension unless otherwise noted.

Figure 4:
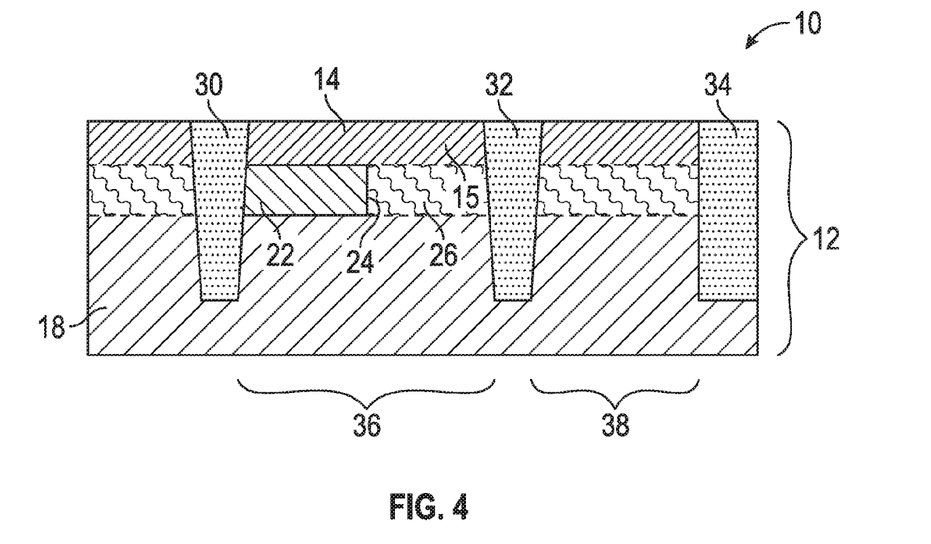

Referring to the exemplary embodiment in FIG. 4, a plurality of shallow trench isolations are formed in the substrate 12, including a first isolation structure 30, a second isolation structure 32, and a third isolation structure 34. The first, second, and third isolation structures 30, 32, 34 are formed such that they extend through the active layer 14 (including parts of the active layer extension 15, as mentioned above), past the partial buried insulator 22, and into the handle layer 18 but not all the way through the handle layer 18. As such, the first, second, and third isolation structures 30, 32, 34 each overlie a portion of the handle layer 18. The first and second isolation structures 30, 32 define a memory area 36 between them, where the memory area 36 includes the partial buried insulator 22 and at least a portion of the substrate extension 26. The second and third isolation structures 32, 34 define a well contact area 38 therebetween, so the well contact area 38 and the memory area 36 are separated by the second isolation structure 32. The well contact area 38 includes at least a portion of the substrate extension 26, and the well contact area 38 may not include any of the partial buried insulator 22 in some embodiments. The first isolation structure 30 may be formed such that it contacts the partial buried insulator 22 on one side within the memory area 36, and the second isolation structure 32 may be formed such that the substrate extension 26 is positioned between the partial buried insulator 22 and the second isolation structure 32.

In an exemplary embodiment, the first, second, and third shallow trench isolation structures 30, 32, 34 (and other shallow trench isolation structures) are formed by first forming a trench (not illustrated). A photoresist layer (not illustrated) and a mask (not illustrated) may be formed and patterned to expose the substrate 12 at the location of the trenches, and the trenches may be formed by a reactive ion etch with silicon hexafluoride. The photoresist layer and mask may then be removed, and an electrically insulating material such as silicon dioxide may be deposited within the trenches. Silicon dioxide may be formed by chemical vapor deposition using silane and oxygen. Overburden can then be removed by chemical mechanical planarization. Other techniques and/or materials may be used to form the shallow trench isolations in alternate embodiments, but the first, second, and third isolation structures 30, 32, 34 are formed of an electrically insulating material in all embodiments.

Figure 5:
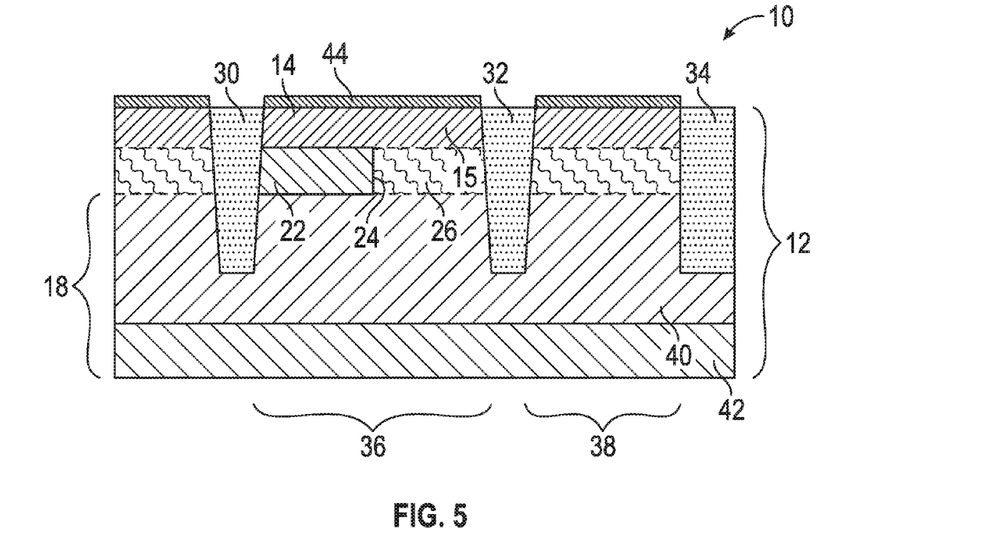

Reference is now made to the exemplary embodiment in FIG. 5. A first well 40 is formed in the handle layer 18 by implanting conductivity determining impurities (dopants). A deep well 42 may also be formed underlying the first well 40, where the deep well 42 has the opposite type of conductivity determining impurities as the first well 40. In an exemplary embodiment, the first well 40 includes "P" type conductivity determining impurities and the deep well 42 includes "N" type conductivity determining impurities, but the type of conductivity determining impurities may be reversed in alternate embodiments. "P" type conductivity determining impurities primarily include boron, aluminum, gallium, and indium, but other materials can also be used. "N" type conductivity determining impurities primarily include phosphorous, arsenic, and/or antimony, but other materials can also be used.

The conductivity determining impurities may be implanted by ion implantation. Ion implantation involves ionizing the conductivity determining impurities and propelling the ions into the substrate 12 under the influence of an electrical field. The strength of the electric field may determine the depth of the ion implantation, so the deep well 42 may be formed underlying the first well 40, and the first well 40 may be formed without significantly increasing the conductivity determining impurity concentration in the active layer 14. As such, the first well 40 may have a first well concentration of conductivity determining impurities that is less than an active layer concentration of conductivity determining impurities within the active layer 14. The first well 40 may have a concentration gradient of conductivity determining impurities, where the first well concentration (in the handle layer 18) is lower directly underlying the partial buried insulator 22 and the substrate extension 26 then at deeper locations that are further from the partial buried insulator 22 and the substrate extension 26. There may be conductivity determining impurities underlying the first, second and third isolation structures 30, 32, 34 within the first well 40 and within the deep well 42 in some embodiments. The substrate 12 may be annealed after the ion implantation to repair crystal damage and to electrically active the conductivity determining impurities, such as at temperatures ranging from about 500 degrees centigrade (° C.) to about 1,200° C.

A memory gate is then formed overlying the active layer 14, where a portion of the memory gate overlies the original active layer 14 and another portion overlies the active layer extension 15. An exemplary embodiment of a memory gate and a method of forming the same are illustrated in FIGS. 5-13. A tunnel dielectric 44 may be formed overlying the active layer 14, such as by thermal oxidation of the surface of the active layer. The tunnel dielectric 44 may include silicon dioxide, but other electrically insulating materials may be used in alternate embodiments.

Figure 6:
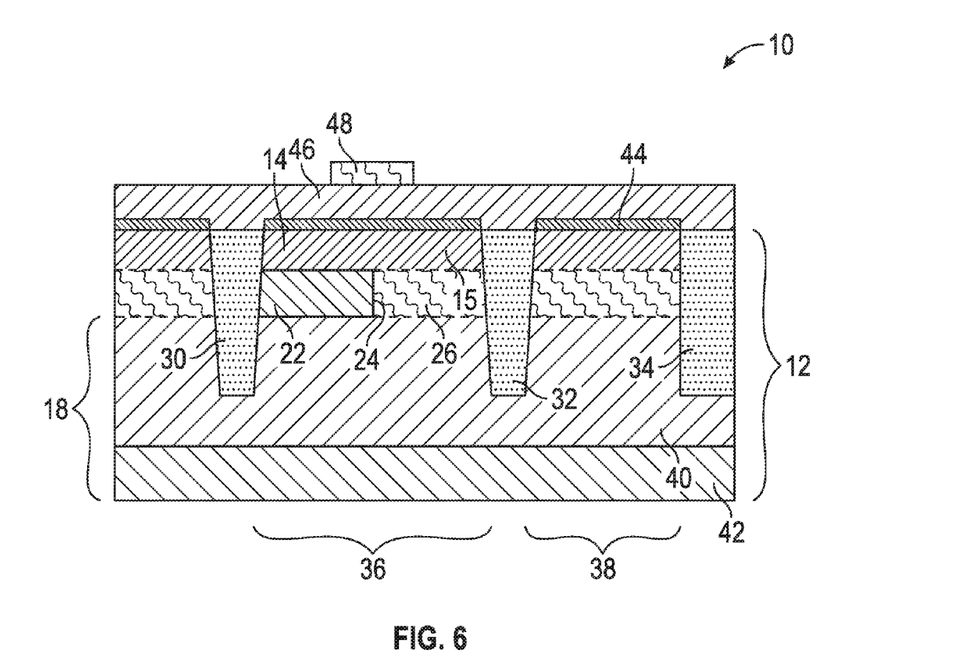

A floating gate layer 46 is formed overlying the tunnel dielectric 44, and a floating gate photoresist layer 48 is formed and patterned overlying the floating gate layer 46, as illustrated in an exemplary embodiment in FIG. 6. The floating gate layer 46 may include polysilicon with impurities, where the floating gate layer 46 is configured for use as a memory element by storing electrons. In an exemplary embodiment, the floating gate layer 46 is formed with phosphorous for electron storage, but the floating gate layer 46 may also include carbon doped polysilicon or other materials that can serve as a floating gate in a memory cell. Polysilicon may be formed by low pressure chemical vapor deposition in a silane environment, and the dopant may be included with the silane during deposition or implanted after the floating gate layer 46 is formed. The floating gate photoresist layer 48 may be formed and patterned as described above. In an exemplary embodiment, the floating gate photoresist layer 48 is formed such that a portion of the floating gate photoresist layer 48 directly overlies the partial buried insulator 22, and another portion of the floating gate photoresist layer 48 directly overlies the substrate extension 26.

Figure 7:
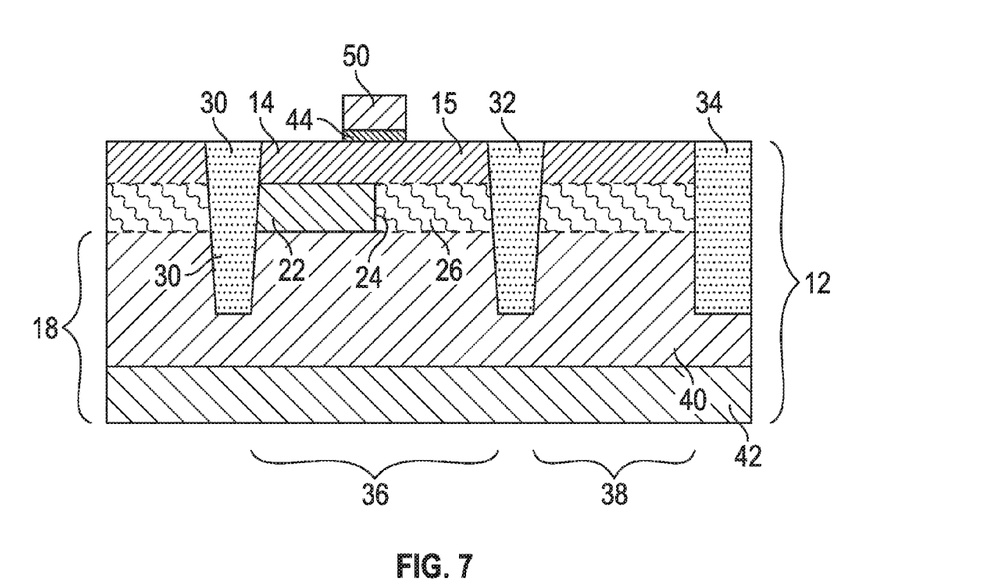

Referring to the exemplary embodiment illustrated in FIG. 7, with continuing reference to FIG. 6, the floating gate layer 46 and the tunnel dielectric 44 are removed except where covered by the floating gate photoresist layer 48 to form the floating gate 50 overlying the tunnel dielectric 44. Excess portions of the floating gate layer 46 and the tunnel dielectric 44 may be removed with appropriate selective etchants. For example, the floating gate layer 46 may be removed with a reactive ion etch using chlorine gas and hydrogen bromide, and the underlying tunnel dielectric 44 may be removed with a subsequent reactive ion etch using carbon tetrafluoride. However, other etchants or etch techniques may be used in alternate embodiments.

Figure 8:
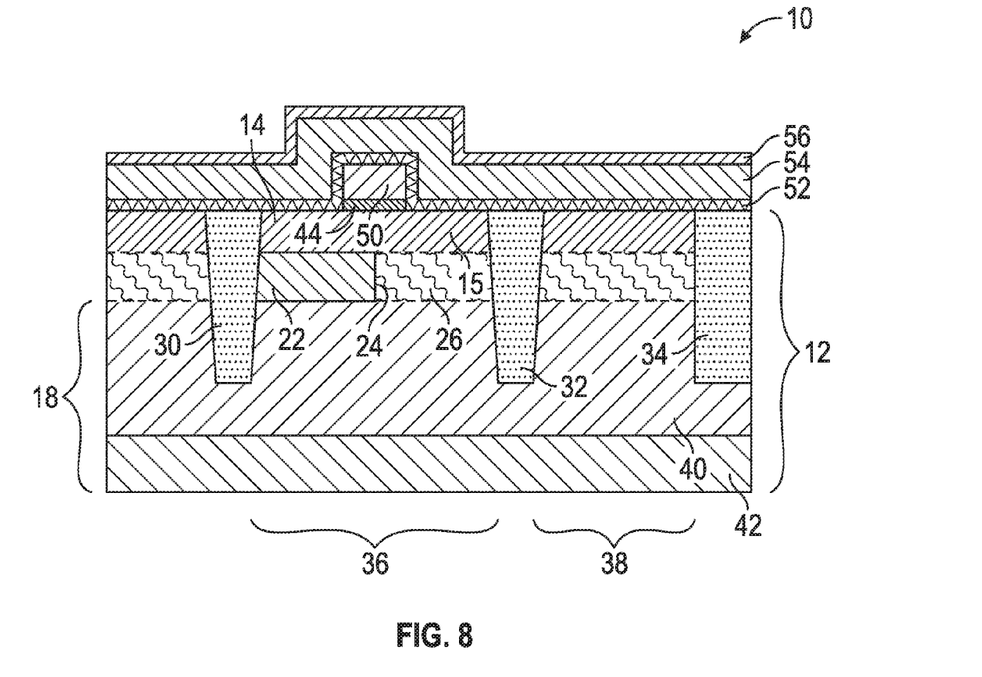

Referring now to FIG. 8, a gate dielectric layer 52 is formed overlying the floating gate 50, a control gate layer 54 is formed overlying the gate dielectric layer 52, and a memory gate hard mask 56 is formed overlying the control gate layer 54. In an exemplary embodiment, the gate dielectric layer 52 includes a silicon dioxide layer underlying a silicon nitride layer that in turn underlies a silicon dioxide layer (where each layer is not individually illustrated), which is sometimes referred to as an ONO layer, but other electrically insulating materials may be used in the gate dielectric layer 52 in alternate embodiments. Silicon dioxide can be formed by chemical vapor deposition using silane and oxygen, and silicon nitride can be formed by low pressure chemical vapor deposition using ammonia and dichlorosilane, but other techniques and/or compounds may be used in alternate embodiments. The control gate layer 54 may be formed from polysilicon with conductivity determining ions, as described above, but other materials may be used in alternate embodiments. The memory gate hard mask 56 may be formed from silicon nitride, but other hard mask materials may also be used in alternate embodiments, such as silicon carbon nitride.

Figure 9:
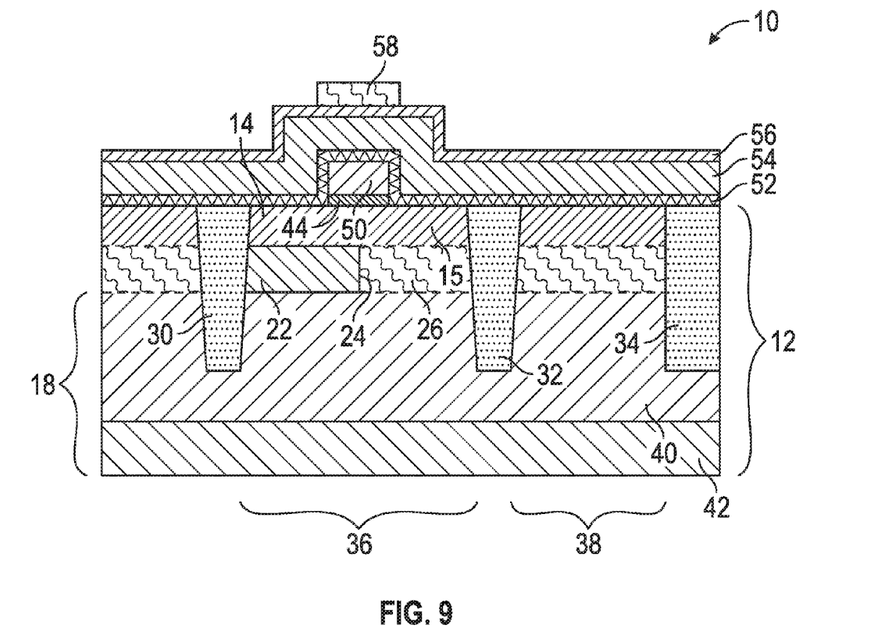
Figure 10:
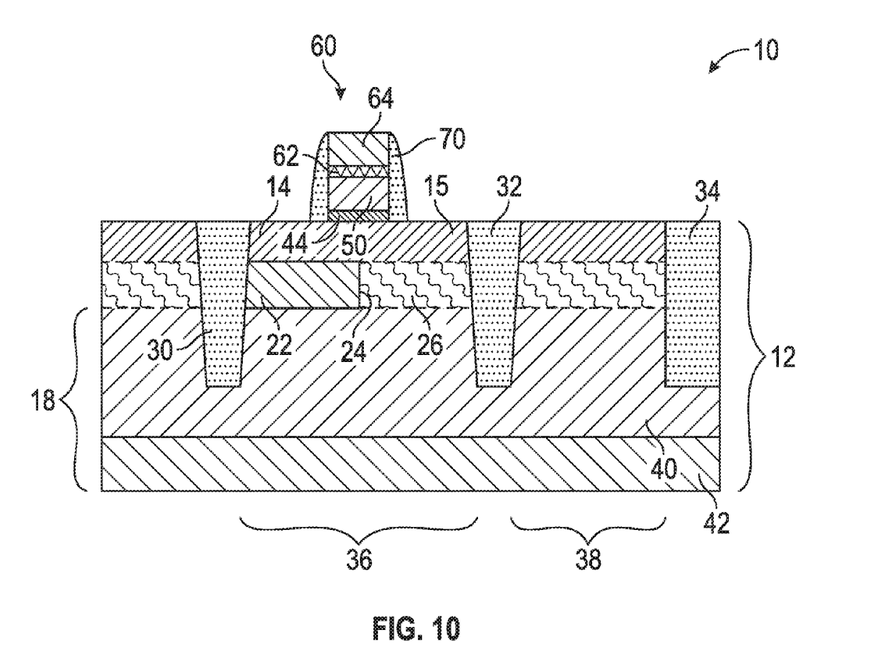

A memory gate photoresist layer 58 may be formed and patterned overlying the floating gate 50, as illustrated in FIG. 9 with continuing reference to FIG. 8. A memory gate 60 may then be formed by removing excess portions of the memory gate hard mask 56, the control gate layer 54, the gate dielectric layer 52, and optionally excess portions of the floating gate 50 and the tunnel dielectric 44, as illustrated in FIG. 10 with continuing reference to FIGS. 8 and 9. These layers may be removed with a reactive ion etch using appropriate etchants, where the layers may be removed individually with different etchants or with the same etchant, such as carbon tetrafluoride. The memory gate hard mask 56 may be removed after the excess portions of the control gate layer 54 and the gate dielectric layer 52 are removed, such as with a wet etch using hot phosphoric acid. The removal of excess portions of the various layers produces a gate dielectric 62 from the gate dielectric layer 52 and a control gate 64 from the control gate layer 54, so the memory gate 60 may include a control gate 64 overlying a gate dielectric 62 that in turn overlies a floating gate 50 that in turn overlies a tunnel dielectric 44.

Spacers 70 may be formed along side walls of the memory gate 60. The electrically insulating spacers 70 can be formed by blanket depositing silicon nitride followed by an anisotropic etch of the deposited silicon nitride, which leaves the vertical portions adjacent to the memory gate 60 in place as the spacers 70. Silicon nitride may be deposited by low pressure chemical vapor deposition using ammonia and silane, and a dry plasma etch with hydrogen and nitrogen trifluoride will anisotropically remove the silicon nitride. The memory gate 60 is formed overlying the active layer 14 within the memory area 36, where the memory gate 60 is directly overlies at least a portion of the original active layer 14 and the memory gate 60 also directly overlies at least a portion of the active layer extension 15. As such, a portion of the memory gate 60 directly overlies the partial buried insulator 22 and another portion of the memory gate 60 directly overlies the substrate extension 26.

Figure 11:
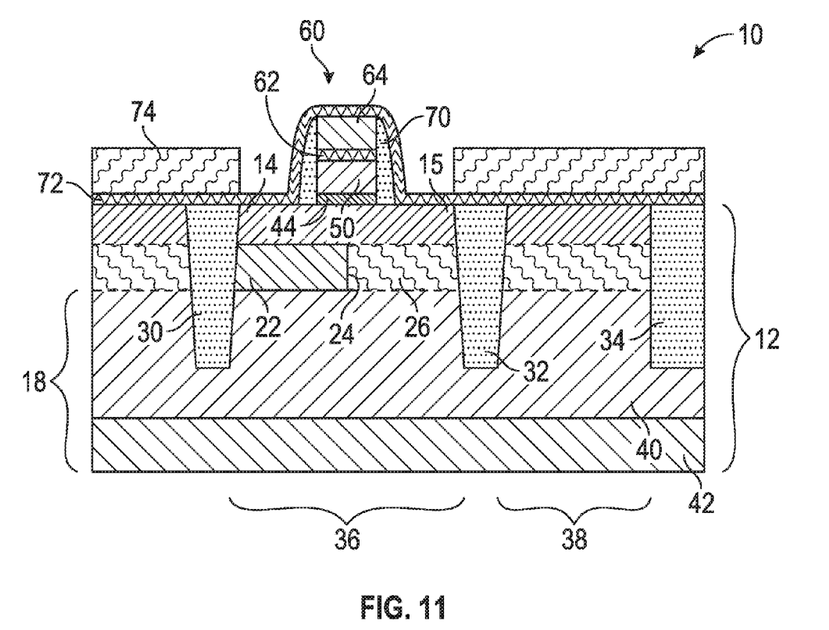

Referring now to FIG. 11, a source/drain hard mask 72 and a source/drain photoresist layer 74 are formed and patterned overlying the substrate 12 and the memory gate 60. The source/drain hard mask 72 may be formed of silicon nitride, as described above, where FIG. 11 illustrates the source/drain photoresist layer 74 after patterning and the source/drain hard mask 72 before patterning. The exposed portions of the source/drain hard mask 72 may be removed with a wet etch using hot phosphoric acid. Once the source/drain hard mask 72 is patterned (not illustrated), the source/drain photoresist layer 74 may be removed, such as with an oxygen containing plasma.

Figure 12:
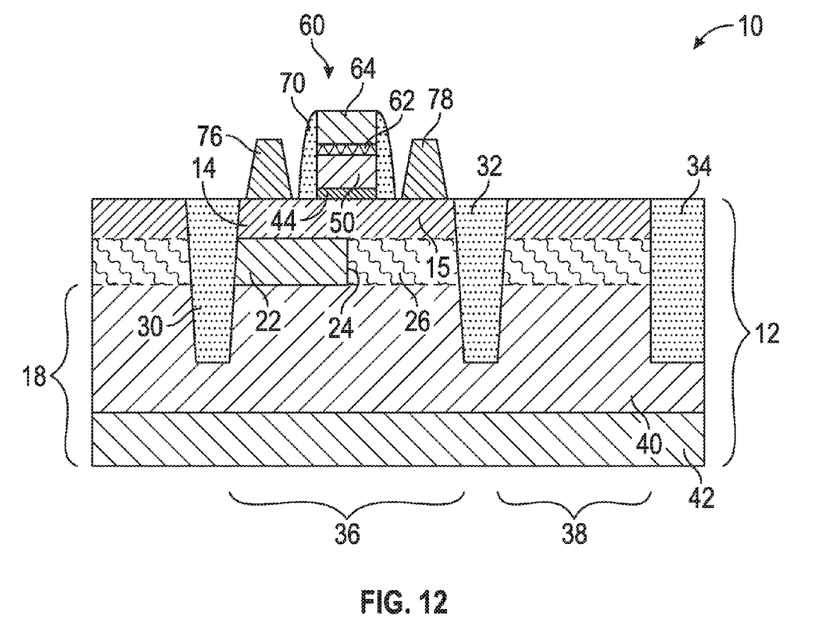

A source 76 and a drain 78 may be formed on opposite sides of the memory gate 60, as illustrated in FIG. 12 with continuing reference to FIG. 11. The source 76 and drain 78 may be formed by epitaxial growth, where the patterned source/drain hard mask 72 prevents epitaxial growth in other locations. The source 76 and drain 78 are formed overlying the active layer 14 in the memory area 36, where the source 76 may directly overlie the partial buried insulator 22 and the drain 78 may directly overlie the substrate extension 26. Once the source 76 and drain 78 are formed, the source/drain hard mask 72 may be removed, such as with a wet etch using hot phosphoric acid.

Figure 13:
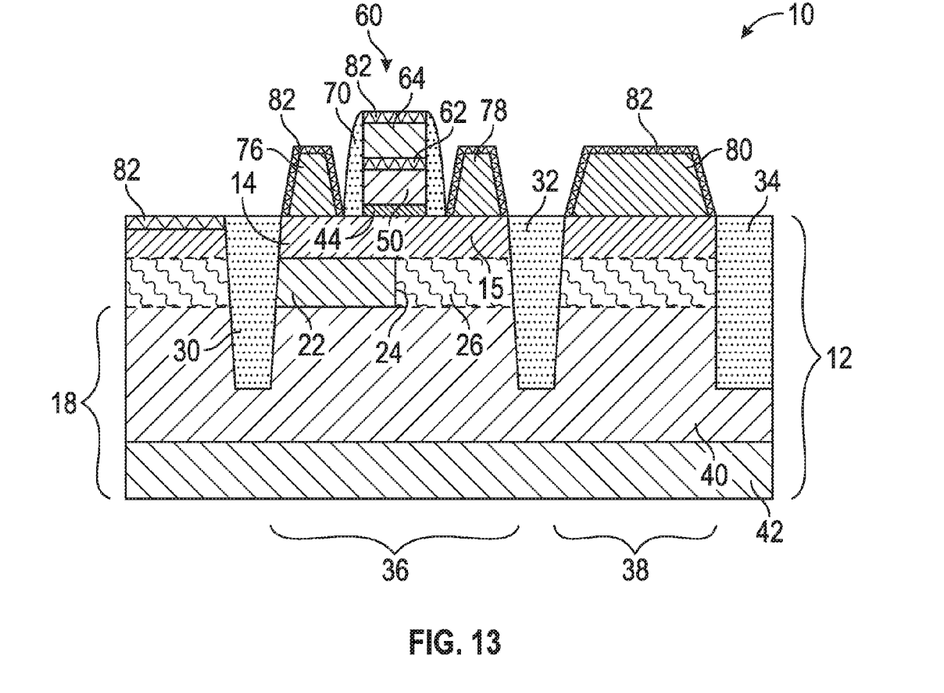

A well contact 80 may be formed overlying the substrate 12 in the well contact area 38, as illustrated in FIG. 13, using a hard mask, photoresist, and epitaxial growth as described for the source 76 and drain 78 above. In an alternate embodiment (not illustrated), the well contact 80 may be formed within the substrate 12 in the well contact area 38 by ion implantation. The source 76 and/or drain 78 may be raised above the substrate 12, as illustrated, due in part to concerns with contact resistance as a result of the relatively thin active layer 14 for a full depleted semiconductor-on-insulator (FDSOI) substrate 12. The well contact 80 does not overlie a buried insulator layer 16 in exemplary embodiments, so the well contact 80 may be formed within the substrate 12 without interference from an underlying buried insulator layer 16. In all embodiments, the well contact 80 is in electrical communication with the substrate 12 in the well contact area 38. Silicides 82 may be formed at exposed surfaces that include silicon, such as at the surface of the active layer 14 illustrated to the left of the first isolation structure 30, the source 76 and drain 78, the control gate 64 of the memory gate 60, and the well contact 80. The silicides 82 may be formed by depositing a thin layer of metal on the exposed surfaces, such as by sputtering or chemical vapor deposition, and then annealing. In an exemplary embodiment, nickel (Ni) is deposited and then annealed at a first temperature of about 240° C. to about 320° C. for about 10 to about 40 seconds, followed by a second anneal at about 400° C. to about 500° C. for about 20 to about 40 seconds. Other metals can be used, and the annealing process is adjusted for the selected metal. A wet etch is then used to selectively remove the nickel overburden, which does not react with materials other than silicon. For example, nickel can be selectively etched with a mixture of nitric acid, acetic acid, and sulfuric acid.

The well contact 80 is in electrical communication with the memory gate 60, where electrical current can flow through the active layer 14 and the substrate extension 26 underlying the well contact 80, through the first well 40 underlying the second isolation structure 32, through the substrate extension 26 underlying the drain 78 and within the memory area 36, and through the active layer 14 underlying the memory gate 60. As such, a much lower voltage applied to the well contact 80 will bias the active layer 14 underlying the memory gate 60 than for a memory gate where the underlying active layer is electrically isolated and insulated by shallow trench isolations and a buried insulator layer. Furthermore, any holes generated in the active layer 14 of the memory area 36 can flow through the first well 40 to the well contact 80, which reduces the buildup of holes and reduces the likelihood of a kink effect as compared to a memory gate that is electrically isolated by shallow trench isolations and buried insulator layers.

While at least one exemplary embodiment has been presented in the foregoing detailed description, it should be appreciated that a vast number of variations exist. It should also be appreciated that the exemplary embodiments are only examples, and are not intended to limit the scope, applicability, or configuration of the application in any way. Rather, the foregoing detailed description will provide those skilled in the art with a convenient road map for implementing one or more embodiments, it being understood that various changes may be made in the function and arrangement of elements described in an exemplary embodiment without departing from the scope, as set forth in the appended claims.

What is claimed is:

1. An integrated circuit comprising:
   a substrate comprising an active layer and a handle layer, wherein the active layer overlies the handle layer;
   a partial buried insulator overlying the handle layer and underlying the active layer, wherein the partial buried insulator terminates at a buried insulator termination point, and wherein the partial buried insulator comprises an electrically insulating material;
   a substrate extension adjacent to the partial buried insulator, wherein the substrate extension overlies the handle layer and underlies the active layer, wherein the substrate extension comprises a semiconductive material, and wherein the substrate extension directly contacts the partial buried insulator at the buried insulator termination point; and
   a memory gate overlying the active layer.

2. The integrated circuit of claim 1 wherein a portion of the memory gate directly overlies the partial buried insulator and another portion of the memory gate directly overlies the substrate extension.

3. The integrated circuit of claim 1 further comprising:
   a first isolation structure extending through the active layer and into the handle layer; and
   a second isolation structure extending through the active layer and into the handle layer, wherein a memory area is defined between the first isolation structure and the second isolation structure, and wherein the partial buried insulator and the substrate extension are positioned in the memory area.

4. The integrated circuit of claim 3 further comprising:
   a well contact positioned outside of the memory area.

5. The integrated circuit of claim 4 further comprising:
   a third isolation structure extending through the active layer and into the handle layer, wherein a well contact area is defined between the third isolation structure and the second isolation structure, and wherein the well contact is positioned within the well contact area.

6. The integrated circuit of claim 5 wherein the well contact overlies the active layer within the well contact area.

7. The integrated circuit of claim 3 further comprising:
   a source;
   a drain, wherein the memory gate is positioned between the source and the drain, and wherein the source and the drain overlie the active layer within the memory area.

8. The integrated circuit of claim 3 wherein the partial buried insulator directly contacts the first isolation structure and the substrate extension directly contacts the second isolation structure.

9. The integrated circuit of claim 3 further comprising:
   a first well defined within the handle layer, wherein the first well has a first well concentration of conductivity determining impurities; and wherein
   the active layer within the memory area has an active layer concentration of conductivity determining impurities that is less than the first well concentration of conductivity determining impurities.

10. The integrated circuit of claim 9 further comprising a deep well defined within the handle layer, wherein the first well overlies the deep well, wherein the first well comprises one of P or N type conductivity determining impurities and the deep well comprises the other of P or N type conductivity determining impurities.

11. The integrated circuit of claim 9 wherein the first well concentration comprises a gradient.

12. The integrated circuit of claim 1 further comprising:
    a source overlying the active layer; and
    a drain overlying the active layer, wherein the memory gate is between the source and the drain.

13. The integrated circuit of claim 1 wherein the memory gate comprises:
    a tunnel dielectric overlying the active layer; and
    a floating gate overlying the tunnel dielectric.

14. The integrated circuit of claim 13 wherein the memory gate comprises:
    a gate dielectric overlying the floating gate; and
    a control gate overlying the gate dielectric.

15. An integrated circuit comprising:
    a substrate comprising an active layer, a partial buried insulator, and a handle layer, wherein the active layer overlies the partial buried insulator, and the partial buried insulator overlies the handle layer;
    a first isolation structure passing through the active layer and into the handle layer;
    a second isolation structure passing through the active layer and into the handle layer, wherein a memory area is defined between the first isolation structure and the second isolation structure, and wherein the partial buried insulator is within the memory area;

a third isolation structure passing through the active layer and into the handle layer, wherein a well contact area is defined between the second isolation structure and the third isolation structure;

a memory gate overlying the active layer in the memory area; and a well contact in electrical communication with the substrate in the well contact area, wherein the well contact is in electrical communication with the active layer within the memory area.

16. The integrated circuit of claim 15 further comprising:
a substrate extension positioned within the memory area, wherein the substrate extension underlies the active layer and overlies the handle layer, and wherein the substrate extension directly contacts the partial buried insulator.

17. The integrated circuit of claim 16 wherein a portion of the memory gate directly overlies the partial buried insulator and another portion of the memory gate directly overlies the substrate extension.

18. The integrated circuit of claim 16 further comprising:
a source overlying the active layer in the memory area, wherein the source directly overlies the partial buried insulator; and a drain overlying the active layer in the memory area, wherein the drain directly overlies the substrate extension.

19. The integrated circuit of claim 15 wherein the well contact overlies the active layer in the well contact area.

20. A method of producing an integrated circuit comprising:

removing a portion of an active layer from a substrate;

removing a portion of a buried insulator layer from the substrate to form a partial buried insulator, wherein a remaining portion of the active layer overlies the partial buried insulator;

epitaxially growing a substrate extension adjacent to the partial buried insulator;

forming an active layer extension directly overlying the substrate extension, wherein the active layer extension forms a portion of the active layer;

forming a first isolation structure in the substrate;

forming a second isolation structure in the substrate such that the partial buried insulator and the substrate extension are positioned between the first isolation structure and the second isolation structure; and forming a memory gate overlying the active layer between the first isolation structure and the second isolation structure.

* * * * *